SEPARATELY CARTRIDGED THERMOELECTRIC ELEMENTS AND COUPLES

Filed March 29, 1963 2 Sheets-Sheet 1

INVENTORS.
SOEREN S. NIELSEN
JOHN J. O'CONNOR
JEFFREY N. SHINN
BY Harold A. Levey, Jr.
ATTORNEY

INVENTORS.
SOEREN S. NIELSEN
JOHN J. O'CONNOR
JEFFREY N. SHINN

BY Harold A. Levey, Jr.
ATTORNEY

United States Patent Office 3,351,498
Patented Nov. 7, 1967

3,351,498

SEPARATELY CARTRIDGED THERMOELECTRIC ELEMENTS AND COUPLES

Jeffrey N. Shinn, Scotia, N.Y., and Soeren S. Nielsen, Topsfield, and John J. O'Connor, Dorchester, Mass., assignors to General Electric Company, a corporation of New York Filed Mar. 29, 1963, Ser. No. 268,953
11 Claims. (Cl. 136—205)

This invention relates generally to thermoelectric generators and more particularly, to thermoelectric generators comprising a plurality of single-couple thermoelectric components.

Thermoelectric generation of electrical power is fraught with problems. One inherent, and obvious, problem arises from the temperature gradient between the junctions which is necessary for the thermocouple to function. Since this temperature gradient must be maintained, effective thermal insulation is needed between the hot and cold junctions. The temperature gradient further causes mechanical stress problems since the hot junction, and its surrounding structure, expands a great deal more than the cold junction and its surrounding structure. This expansion difference causes large and often damaging lateral stresses in the thermoelectric elements if they are rigidly secured to the heat exchange surfaces and the most thermoelectrically-efficient materials now available are not capable of withstanding significant lateral stresses. Such stresses may be avoided by affixing only one side of the couples rigidly to its heat exchange surface and allowing slippage on the other side. Such a slip contact, however, introduces a rather high thermal impedance and would still produce lateral stress loading of the elements. A variation of this is rigidly to affix the couples to the cold heat exchange surface and leave the hot conductors mechanically independent of the hot heat transfer surface. One then depends on radiation heat transfer; but even with the best selection of emissive and absorptive surfaces, one must pay a penalty of a 150–200° F. temperature drop.

In practice, hot bonded junctions have rather short lives, so it is customary to use either pressure contacts or bonded contacts with pressure loading. Such an approach is inherently quite compliant to lateral stresses but introduces the disadvantage of high temperature drops on the loading device, and the non-productive weight of these devices and the associated stiff structure.

It is, therefore, an object of this invention to provide an improved unitary thermoelectric cartridge comprising one thermocouple.

It is also an object of this invention to provide a thermoelectric cartridge which is capable of operation with a plurality of such thermoelectric cartridges to provide an effective thermoelectric power generator.

It is a further object of this invention to provide a thermocouple which avoids the adverse effect of lateral stress caused by the temperature gradient impressed on the thermocouple.

Another object of this invention is to provide a thermoelectric power generator comprising a plurality of individual thermocouples each of which may be individually replaced without disturbance of the remaining thermocouples.

Another object of this invention is to provide a thermoelectric power generator comprising a plurality of individual thermocouples wherein the output of each thermocouple may be separately determined.

Another object of this invention is to provide a thermoelectric cartridge comprising one element of a thermocouple.

Another object of this invention is to provide an improved thermoelectric power generator comprising a plurality of cooperating cartridges wherein each cartridge comprises one element of a thermocouple.

Briefly stated, in accordance with one aspect of the invention, a thermoelectric power generator is provided comprising a plurality of electrically interconnected thermoelectric cartridges wherein each cartridge is composed of a single thermocouple and is capable of individual replacement and individual output check. Each cartridge comprises a hollow container having an open end and a closed end with a base member secured to the container to close the open end. A P-type thermoelectric element and an N-type thermoelectric element are secured, in juxtaposed relation to each other, within the container by moderate compressive forces exerted on the elements by the closed end of the container and the base member. The ends of the thermoelectric elements which are near the closed end of the container comprise the hot junction and receive heat through the closed end of the container, which is in close proximity to a heat source. Means are disposed between the hot junction and the closed end of the container to minimize transfer of lateral motion to the thermoelectric elements as the closed end of the container thermally expands. In a modified form of the invention, the container houses a single thermoelectric element.

While the specification concludes with claims particularly pointing out and distinctly claiming the subject matter which is regarded as the invention, it is believed the invention will be better understood from the following description taken in connection with the accompanying drawings, in which:

Figure 1:
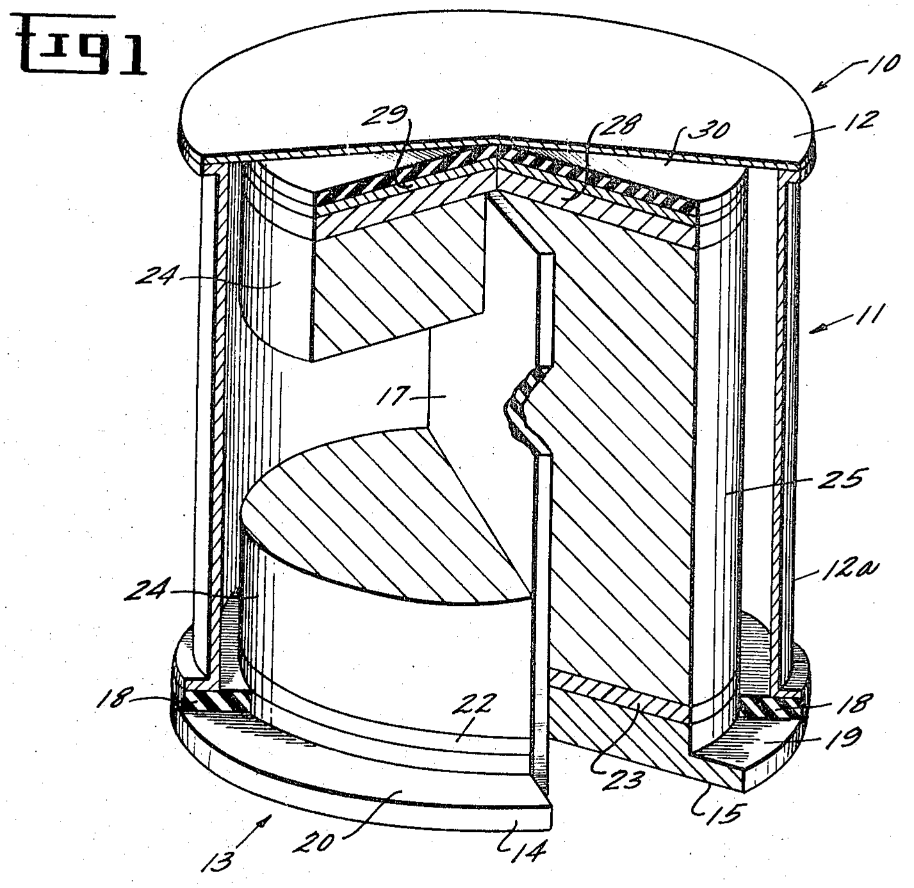
FIGURE 1 is a perspective view, partially in section, of one embodiment of the invention.

Referring now to the drawings, and in particular to FIGURE 1, there is shown a thermoelectric cartridge 10 comprising an outer container 11 having an end wall 12 and a side wall 12*a*. The end wall 12 may be integral with the side wall 12*a* or the end wall 12 may be a separate piece suitably secured to the side wall 12*a* by such means as brazing or welding. Spanning the lower end of the container 11 is an end wall 13 comprising two essentially semi-cylindrical conductors 14 and 15 insulated from each other by insulator 17 which is planar in form and extends upwardly essentially the full length of container 11. Also comprising a part of end wall 13 is an annular insulator 18 which electrically insulates conductors 14 and 15 from the container 11. The annular insulator 18 may be bonded to the surface 19 of conductor 15 and surface 20 of conductor 14. The annular insulator 18 may then be suitably secured to container 11 to provide a hermetically-sealed unit.

An essentially semi-cylindrical diffusion barrier 22 is positioned within the container 11 overlying the surface of conductor 14. A similar diffusion barrier 23 overlies the surface of conductor 15. The function of the diffusion barriers will be discussed more fully hereinafter.

Positioned atop the diffusion barrier 22 is a semi-cylindrical P-type thermoelectric element 24 which extends upwardly to a height essentially commensurate with that of insulator 17. Positioned atop diffusion barrier 23 is an N-type thermoelectric element 25 which also extends to a height essentially equal to that of insulator 17 and thermoelectric element 24. A disk-like diffusion barrier 28, having a planar surface area equal to the total end surface areas of thermoelectric elements 24 and 25, overlies, and is in contact with, the upper ends of the thermoelectric elements 24 and 25.

Thermoelectric materials are classified as either N-type or P-type depending upon the direction of current flow across the cooled junction formed by the thermoelectric metal and another metal when operating as a thermoelectric generator according to the well known Seebeck effect. If the positive current direction at the cold junction is from the thermoelectric metal then it is termed a P-type thermoelectric material. Conversely, if the positive current direction is from the cold junction and toward the thermoelectric material it is termed an N-type thermoelectric material.

The diffusion barriers 22, 23 and 28 serve the dual function of providing a junction material for cooperation with the respective thermoelectric material which could occur if a conventional conductor material were brought into direct contact with certain thermoelectric element materials. The diffusion barriers also serve as molecular barriers to prevent molecules of the conductor material from contaminating the thermoelectric material. For example, if the thermoelectric element material were lead telluride, which is a very effective and efficient thermoelectric element material, and the conductors were copper, there would be a poisoning of the lead telluride by the copper. Since copper is a very effective conductor and lead telluride is a very efficient thermoelectric element material, it is desirable to use each of these materials for their respective functions despite the aforementioned problem encountered when the materials are brought into contact. To achieve this desideratum and still avoid the poisoning problem, the aforementioned diffusion barriers 22 and 23 are disposed between the thermoelectric elements 24 and 25 and their respective conductors 14 and 15. If lead telluride is used as a thermoelectric element, and copper is used as a conductor material, iron is one example of an effective material for use as a diffusion barrier. The diffusion barrier 28 is employed to prevent contact between either thermoelectric element and insulator 30 since such contact could also cause poisoning of the thermoelectric element materials. Diffusion barrier 28 likewise provides electric contact between the thermoelectric elements 24 and 25.

A thin layer 29 of a suitable material such as, for example, silver is provided on the upper surface of diffusion barrier 28 to act as a buffer to allow relative motion between the diffusion barrier 28 and the adjacent insulator 30 which overlies diffusion barrier 28 and is bonded to the end wall 12 of the container 11. The insulator 30 is made preferably from a material which has high thermal conductivity and high electrical resistivity, for example, aluminum oxide. These qualities are essential since heat flow toward the hot junction, which comprises the upper ends of the thermoelectric elements 24 and 25 and the diffusion barrier 28, must not be restricted while at the same time the container 11, which may be constructed from an electrically conductive metal, must not be allowed electrically to short out the hot junction. Although not shown, it is desirable also to fill the gap between the wall **12*a* and elements 24 and 25 with insulation to prevent the elements 24 and 25 from contacting the wall 12*a* in the event they distort or disintegrate as well as to prevent radial heat transfer to or from the wall 12*a***.

When the cartridge 10 is assembled as described above, the thermoelectric elements 24 and 25 as well as the diffusion barriers 22, 23 and 28 are kept in substantial longitudinal alignment with the container 11 by a moderate compressive force between the end walls 12 and 13. The material from which the thermoelectric elements are made will withstand moderate longitudinal compressive forces but are likely to fracture under significant lateral stresses. The layer 29, which serves as a buffer and provides a lubricating effect, minimizes lateral stresses within the thermoelectric elements which may result from thermal expansion of the end wall 12.

An inert gas, such as argon, may be introduced into any remaining annular volume between the outer periphery of the thermoelectric elements 24 and 25 and the inner insulated surface of container 11 to provide an inert environment of essentially atmospheric pressure. Another refinement of the present invention may include the employment of the thinnest possible material in the construction of container 11 to minimize heat conduction along the cylindrical container wall **12*a*** which, in effect, would shunt the temperature gradient between the hot junction and cold junction of the thermocouple.

Thus far the thermoelectric cartridge 10 has been described as having most of the elements generally cylindrical or circular in shape. It should be noted, however, that this particular shape is not critical to the invention and that a configuration such as a rectangular or square cross-section would be equally applicable. For example, the container 10 could be rectangular in cross-section with each of the thermoelectric elements square in cross-section.

Figure 2:
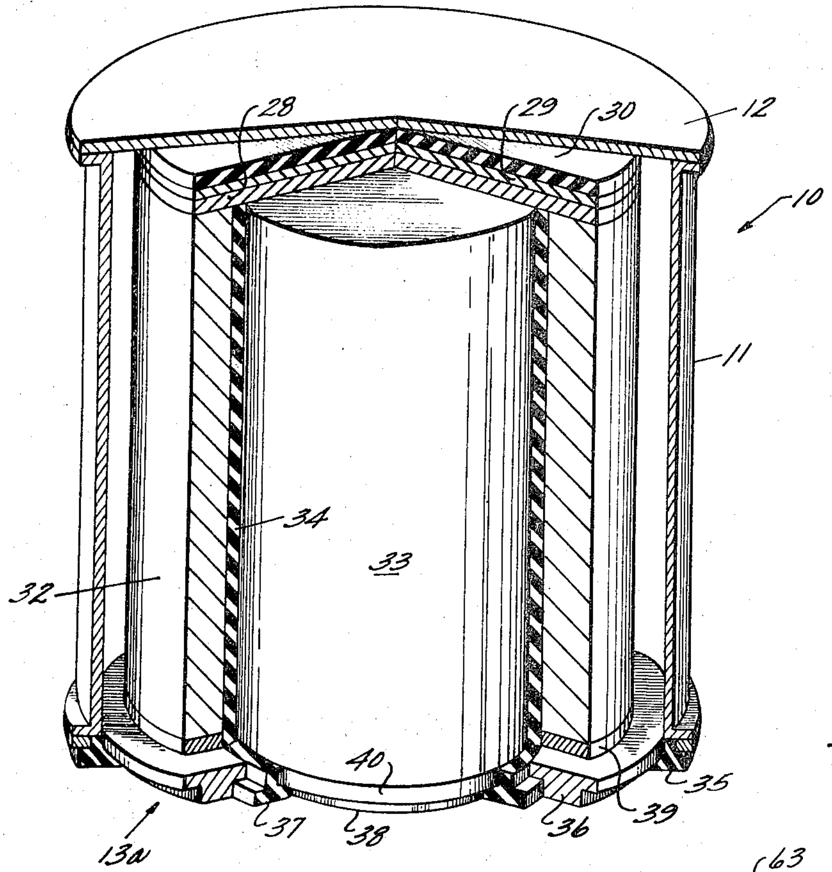
FIGURE 2 is a perspective view of a second embodiment of the invention.

Referring now to FIGURE 2, there is illustrated a modification of the thermoelectric cartridge 10. The outer container 11 is essentially identical to that discussed with regard to the embodiment illustrated in FIGURE 1 as is the end wall 12 of the container 11. The primery difference between the embodiment of FIGURE 2 and the embodiment of FIGURE 1 is that the former employs concentric thermoelectric elements 32 and 33 whereas the embodiment of FIGURE 1 employs semi-cylindrical thermoelectric elements 24 and 25. Since the thermoelectric elements of FIGURE 2 are juxtaposed concentrically, an annular insulator 34 is provided electrically to insulate the thermoelectric elements 32 and 33 from each other. The end wall **13*a* of FIGURE 2 is suitably secured to the container 11 in a manner similar to that described in connection with FIGURE 1. However, the elements comprising the end wall 13*a*** are designed to be compatible with the concentric relationship of the thermoelectric elements.

The end wall **13*a* comprises an outer annular insulator 35 which is suitably secured to the container 11 by such means as brazing. An annular conductor 36 is disposed radially inwardly of the insulator 35 and is secured thereto. Annular insulator 37 is disposed radially inwardly of conductor 36 electrically to insulate conductor 36 from a circular conductor 38 which is disposed radially inwardly of insulator 37 and comprises the central portion of the end wall 13*a*. An annular diffusion barrier 39 is disposed between thermoelectric element 32 and annular conductor 36 while a circular diffusion barrier 40 is disposed between thermoelectric element 33 and conductor 38** to prevent poisoning of the thermoelectric elements by the respective conductors.

The elements comprising the upper portion of the thermoelectric cartridge are identical to those described for the embodiment of FIGURE 1 and are, therefore, given the same numerals. These include a diffusion barrier 28, an insulator 30, and a layer 29 of suitable material for minimizing the transfer of lateral expansion from the insulator 30 to the diffusion barrier 28 as the end wall 12 thermally expands.

Figure 3:
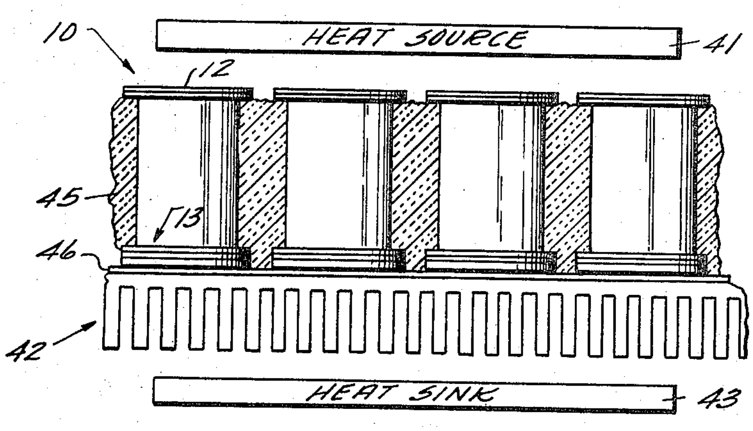
FIGURE 3 is a schematic representation of a thermoelectric power generator employing the device shown in either FIGURE 1 or FIGURE 2.

FIGURE 3 illustrates the adaptability of the thermoelectric cartridges of FIGURES 1 and 2 with regard to interconnecting a plurality of such thermoelectric cartridges to provide a practical thermoelectric power generator. A plurality of thermoelectric cartridges 10 are provided in relatively close proximity of each other so that the plurality of end walls 12 form essentially a planar surface which absorbs heat radiating from a heat source 41 of any suitable construction, the exact construction not being critical to the invention. The end walls 13 of the individual thermoelectric cartridges 10 are secured to a heat-rejecting means 42 which is shown in FIGURE 3 in the form of cooling fins. A heat sink 43 may be provided to cool more effectively the end walls 13 of the individual thermoelectric elements. Insulation members 45 are provided in the interstices between the individual thermoelectric cartridges 10 which are electrically interconnected by electrical circuitry 46 which may be in the form of printed circuitry.

The arrangement shown in FIGURE 3 incorporating the thermal cartridges illustrated in FIGURES 1 and 2, has the advantage of positioning all of the electric circuitry 46 near the cold side of the thermoelectric power generator which alleviates any high temperature design requirements for the circuitry. Also, this arrangement allows for individual replacement of the thermoelectric elements 10 since all that would be required is to remove a given thermoelectric element from the heat-rejecting means 42. The individual thermoelectric elements 10 may be attached to the circuitry 46 and the heat-rejecting means 42 by any suitable means such as by a conventional tube socket connector. The output of any cartridge then may be checked by applying a measuring instrument, such as a voltmeter, to the conductors in the end wall 13 of the cartridge or to the circuitry 46 at each side of the cartridge. By having the heat-absorbing surfaces of the thermoelectric power generator in segments, i.e., a plurality of end walls 12, the aforementioned expansion problems are not as acute since the spacing between the individual end walls 12 provides room for the expansion of the end walls whereas, if the plurality of end walls 12 were integral, the expansion problem would be compounded.

Figure 4:
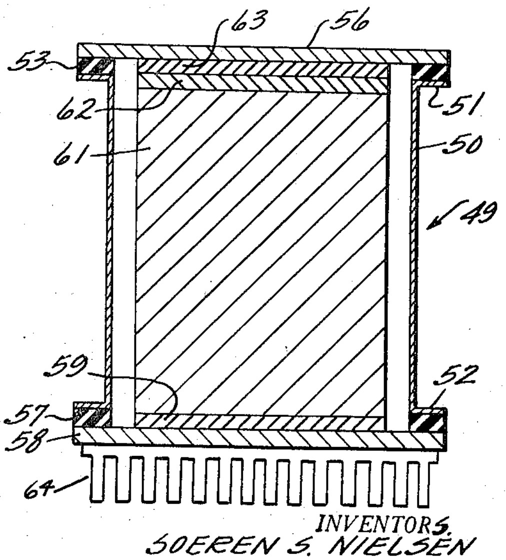
FIGURE 4 is a sectional view of an embodiment of the invention comprising a single element cartridge.

Referring now to FIGURE 4, there is illustrated a further embodiment of the invention which provides an element cartridge 49 containing one element, either an N-type thermoelectric element or a P-type thermoelectric element, rather than a complete thermocouple. The element cartridge 49 comprises a cylindrical container 50 which has a flange 51 at one end and a flange 52 at the opposite end. An annular insulator 53 is secured to the flange 51 by any suitable means. Secured to the annular insulator 53 so as to close one open end of the cylindrical container 50 is an end wall 56. The end wall 56, in addition to closing the open end of the cylindrical container 50, serves as a heat collector and as an electrical conductor for the cartridge.

An annular insulator 57 is secured to flange 52 by any suitable means. The end wall 58 is, in turn, secured to insulator 57 by any suitable means so as to close the lower end of the cylindrical container 50. The end wall 58 also serves as an electrical conductor in a manner similar to the end wall 56, and as a heat sink. A heat rejecting means such as cooling fins 64 may be suitably secured to the end wall 58.

A diffusion barrier 59 is provided adjacent the inner surface of end wall 58 and serves to prevent contamination of thermoelectric element 61 in a manner identical to that discussed above with relation to the embodiments of FIGURES 1 and 2. A diffusion barrier 62 is provided at the other end of thermoelectric element 61 and has a thin layer 63 of suitable material, such as silver, which acts as a buffer to minimize friction between the diffusion barrier 62 and the end wall 56 thereby to minimize the transfer of lateral stress to the thermoelectric element 61 during thermal expansion of end wall 56.

Figure 5:
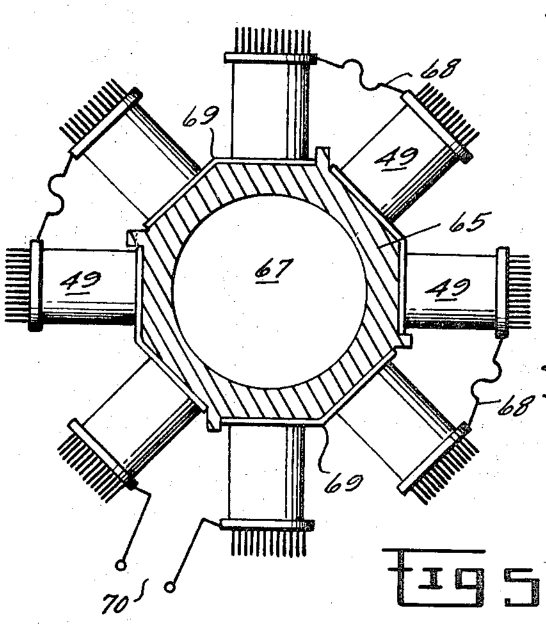
FIGURE 5 is another schematic representation of a thermoelectric power generator employing a plurality of devices as shown in FIGURE 4.

Referring now to FIGURE 5, there is illustrated an arrangement for utilizing a plurality of element cartridges 49, of the type shown in FIGURE 4, to provide an effective thermoelectric power generator. A hollow core 65 serves as a support member to support a plurality of element cartridges 49. The core 65 is preferably constructed from a material having high thermal conductivity and high electrical resistivity as, for example, aluminum oxide. A central opening 67 in the core 65 serves as a heat source area and may, for purposes of illustration, comprise a combustion chamber to provide heat for the thermoelectric power generator. Flexible electric conductors 68 provide electrical continuity between alternate pairs of cartridges 49 at the outer surfaces of the cartridges. Conductors 69 cooperate with end walls 58 of the individual cartridges 49 to provide electrical continuity at the hot side of the cartridges. Electrical conductors 70 serve as the electrical power outlet for the thermoelectric power generator.

As will be evident from the foregoing description, certain aspects of the invention are not limited to the particular details of construction of the examples illustrated, and it is contemplated that various and other modifications or applications will occur to those skilled in the art. It is, therefore, intended that the appended claims shall cover such modifications and applications as do not depart from the true spirit and scope of the invention.

What is claimed as new and desired to be secured by Letters Patent of the United States is:

1. A thermoelectric cartridge comprising
a single thermoelectric element having first and second spaced end portions and
means compressively encapsulating said thermoelectric element including
first and second metal end walls lying in electrically conductive relation to said first and second end portions, respectively,
a thin metal side wall surrounding said thermoelectric element in laterally spaced relation, and
means insulatively sealing said side wall to said end walls.

2. A thermoelectric cartridge according to claim 1 in which said thermoelectric element is comprised of lead telluride, said end walls are comprised of copper, and said encapsulating means includes iron diffusion barriers interposed between said end walls and said lead telluride.

3. A thermoelectric cartridge according to claim 2 in which a silver layer is interposed between one of said end walls and said diffusion barriers.

4. A thermoelectric generator including
a heat source,
a heat sink,
means insulatively mounting a plurality of separate thermoelectric cartridges as defined by claim 1 in laterally spaced relation, each of said cartridges being mounted with said first end wall adjacent said heat source and said second end wall adjacent said heat sink, and
means connecting said thermoelectric cartridges electrically in series.

5. A thermoelectric generator according to claim 4 in which said insulative mounting means defines a hollow combustion chamber.

6. A thermoelectric cartridge comprising
means forming a thermoelectric couple comprising
a P-type thermoelectric element,
an N-type thermoelectric element,
each of said thermoelectric elements including first and second spaced end portions, and
means electrically connecting said first end portions of said thermoelectric elements while electrically insulating the remainder of said elements,
means compressively encapsulating said thermoelectric couple forming means comprising
a first end wall segment providing an electrical contact with said second end portion of said P-type thermoelectric element,
a second end wall segment providing an electrical contact with said second end portion of said N-type element,
said first and second end wall segments being laterally spaced,
an outer container having a thin metal side wall laterally spaced from said thermoelectric couple, and means insulatively sealing said side walls to said end wall segments.

7. A thermoelectric cartridge according to claim 6 in which said thermoelectric elements are comprised of lead telluride, said end wall segments are comprised of copper, and including an iron diffusion barrier interposed between each of said segments and said second end portions of said thermoelectric elements.

8. A thermoelectric cartridge according to claim 6 additionally including a thermally conductive, electrically insulative element having a thermal coefficient of expansion differing from that of said first end portion connecting means, said element being mounted interiorly of said container, and a silver layer interposed between said first end portion connecting means and said element.

9. A thermoelectric cartridge comprising a single lead telluride thermoelectric element having first and second spaced end portions, and means encapsulating said thermoelectric element including first and second end walls comprised of copper, and diffusion barrier means interposed between said first and second end portions and said first and second end walls.

10. A thermoelectric cartridge comprising means forming a thermoelectric couple comprising a P-type thermoelectric element comprised of lead telluride, an N-type thermoelectric element comprised of lead telluride, each of said thermoelectric elements including first and second spaced end portions, and means electrically connecting said first end portions of said thermoelectric elements, and means encapsulating said thermoelectric couple forming means including first and second end wall segments comprised of copper, and first and second iron diffusion barriers interposed between said first and second end wall segments and said second spaced end portions of said P- and N-type thermoelectric elements, respectively.

11. In a thermoelectric cartridge, the sub-combination comprising means forming a thermoelectric couple comprising a P-type thermoelectric element, an N-type thermoelectric element, each of said thermoelectric elements including first and second spaced end portions, and an iron barrier electrically connecting said first end portions of said thermoelectric elements, a thermally conductive, electrically insulative element having a thermal coefficient of expansion differing from that of said iron barrier, and a silver layer interposed between and in contact with said thermally conductive, electrically insulative element and said barrier.

References Cited

UNITED STATES PATENTS

| | | | |
|---|---|---|---|
| 1,848,655 | 3/1932 | Petrik | 136—212 X |
| 3,040,539 | 6/1962 | Gaugler | 136—204 X |
| 3,125,860 | 3/1964 | Reich | 136—203 X |
| 3,127,749 | 4/1964 | Bergvall et al. | 136—204 X |
| 3,214,295 | 10/1965 | Danko et al. | 136—202 |

ALLEN B. CURTIS, *Primary Examiner.*

WINSTON A. DOUGLAS, *Examiner.*